(12) United States Patent
Kim

(10) Patent No.: US 8,338,870 B2
(45) Date of Patent: Dec. 25, 2012

(54) LAYOUT OF SEMICONDUCTOR DEVICE

(75) Inventor: Sang Heon Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 232 days.

(21) Appl. No.: 12/494,239

(22) Filed: Jun. 29, 2009

(65) Prior Publication Data

US 2010/0171159 A1    Jul. 8, 2010

(30) Foreign Application Priority Data

Jan. 5, 2009    (KR) .......................... 10-2009-0000423

(51) Int. Cl.
*H01L 27/108* (2006.01)

(52) U.S. Cl. ........ 257/296; 257/298; 257/300; 257/304; 257/305; 257/306; 257/311

(58) Field of Classification Search ................ 257/296, 257/298, 300, 304, 305, 311
See application file for complete search history.

(56) References Cited

U.S. PATENT DOCUMENTS

| | | | | |
|---|---|---|---|---|
| 5,014,103 A | * | 5/1991 | Ema ............................. | 257/296 |
| 5,305,252 A | * | 4/1994 | Saeki ............................ | 365/63 |
| 5,374,576 A | * | 12/1994 | Kimura et al. ............... | 438/253 |
| 5,378,906 A | * | 1/1995 | Lee .............................. | 257/296 |
| 5,457,064 A | * | 10/1995 | Lee .............................. | 438/253 |
| 5,544,095 A | * | 8/1996 | Longway et al. ............. | 365/63 |
| 5,744,844 A | * | 4/1998 | Higuchi ....................... | 257/369 |
| 6,239,500 B1 | * | 5/2001 | Sugimachi ................... | 257/203 |
| 6,455,884 B1 | * | 9/2002 | Chan et al. ................... | 257/296 |
| 6,573,549 B1 | * | 6/2003 | Deng et al. ................... | 257/296 |
| 6,576,943 B1 | * | 6/2003 | Ishii et al. .................... | 257/296 |
| 6,649,956 B2 | * | 11/2003 | Yoshida et al. ............... | 257/295 |
| 6,677,633 B2 | * | 1/2004 | Sakata et al. ................. | 257/296 |
| 6,690,050 B2 | * | 2/2004 | Taniguchi et al. ............ | 257/296 |
| 6,756,625 B2 | * | 6/2004 | Brown ......................... | 257/300 |
| 6,921,935 B2 | * | 7/2005 | Brown ......................... | 257/300 |
| 6,922,354 B2 | * | 7/2005 | Ishikura et al. .............. | 365/154 |
| 6,927,443 B2 | * | 8/2005 | Arigane et al. .............. | 257/300 |
| 6,953,959 B2 | * | 10/2005 | Yang et al. ................... | 257/296 |
| 7,006,370 B1 | * | 2/2006 | Ramesh et al. ............... | 365/63 |
| 7,046,543 B2 | * | 5/2006 | Arimoto et al. .............. | 365/149 |
| 7,053,434 B2 | * | 5/2006 | Kang ........................... | 257/296 |
| 7,064,370 B2 | * | 6/2006 | Woo ............................ | 257/296 |
| 7,067,864 B2 | * | 6/2006 | Nishida et al. ............... | 257/296 |
| 7,145,194 B2 | * | 12/2006 | Nishida et al. ............... | 257/296 |
| 7,193,278 B2 | * | 3/2007 | Song ............................ | 257/393 |
| 7,411,238 B2 | * | 8/2008 | Nishida et al. ............... | 257/296 |
| 7,453,126 B2 | * | 11/2008 | Ishii ............................. | 257/393 |
| 7,471,545 B2 | * | 12/2008 | Nii ............................... | 365/154 |
| 7,508,022 B2 | * | 3/2009 | Amo et al. ................... | 257/296 |
| 7,525,145 B2 | * | 4/2009 | Shukuri ....................... | 257/311 |
| 7,582,925 B2 | * | 9/2009 | Jung et al. .................... | 257/296 |

(Continued)

FOREIGN PATENT DOCUMENTS

KR    1019980006360 A    3/1998

(Continued)

*Primary Examiner* — Fernando L Toledo
*Assistant Examiner* — Mohammed Shamsuzzaman

(57) ABSTRACT

A layout of a semiconductor device is disclosed, which forms one transistor in one active region to reduce the number of occurrences of a bridge encountered between neighboring layers, thereby improving characteristics of the semiconductor device. Specifically, the landing plug connected to the bit line contact is reduced in size, so that a process margin of word lines is increased to increase a channel length, thereby reducing the number of occurrences of a bridge encountered between the landing plug and the word line.

15 Claims, 7 Drawing Sheets

U.S. PATENT DOCUMENTS

| | | | |
|---|---|---|---|
| 7,830,703 B2* | 11/2010 | Takeda et al. | 365/154 |
| 2002/0024075 A1* | 2/2002 | Kumagai et al. | 257/296 |
| 2002/0038877 A1* | 4/2002 | Ichige et al. | 257/296 |
| 2002/0135003 A1* | 9/2002 | Karasawa et al. | 257/296 |
| 2003/0025163 A1* | 2/2003 | Kwon | 257/360 |
| 2003/0151109 A1* | 8/2003 | Taniguchi et al. | 257/500 |
| 2003/0168685 A1* | 9/2003 | Sakata et al. | 257/296 |
| 2004/0057292 A1* | 3/2004 | Lachenmann et al. | 365/199 |
| 2004/0140495 A1* | 7/2004 | Uchiyama et al. | 257/296 |
| 2004/0196705 A1* | 10/2004 | Ishikura et al. | 365/200 |
| 2005/0012125 A1* | 1/2005 | Summerfelt et al. | 257/295 |
| 2005/0018468 A1* | 1/2005 | Honda | 365/145 |
| 2005/0035387 A1* | 2/2005 | Lee et al. | 257/296 |
| 2005/0082594 A1* | 4/2005 | Brown | 257/306 |
| 2005/0164452 A1* | 7/2005 | Lojek | 438/262 |
| 2006/0028855 A1* | 2/2006 | Matsunaga et al. | 365/145 |
| 2006/0060903 A1* | 3/2006 | Amo et al. | 257/296 |
| 2006/0118849 A1* | 6/2006 | Hidaka et al. | 257/296 |
| 2006/0186447 A1* | 8/2006 | Saitoh | 257/296 |
| 2006/0239057 A1* | 10/2006 | Muller et al. | 365/63 |
| 2006/0289945 A1* | 12/2006 | Nii | 257/393 |
| 2007/0113210 A1* | 5/2007 | Mizuno et al. | 716/5 |
| 2007/0155085 A1* | 7/2007 | Song | 438/199 |
| 2007/0170589 A1* | 7/2007 | Kato et al. | 257/758 |
| 2007/0263428 A1* | 11/2007 | Ishii | 365/154 |
| 2008/0112253 A1* | 5/2008 | Youn et al. | 365/230.06 |
| 2008/0175038 A1* | 7/2008 | Arimoto et al. | 365/149 |
| 2008/0186773 A1* | 8/2008 | Bergemont et al. | 365/185.18 |
| 2009/0065874 A1* | 3/2009 | Ishii | 257/393 |
| 2009/0218608 A1* | 9/2009 | Nishida et al. | 257/296 |
| 2009/0290416 A1* | 11/2009 | Abe | 365/185.05 |
| 2010/0084698 A1* | 4/2010 | Akiyama et al. | 257/306 |
| 2010/0136778 A1* | 6/2010 | Chakihara et al. | 438/587 |

FOREIGN PATENT DOCUMENTS

| | | |
|---|---|---|
| KR | 1020040063348 A | 7/2004 |
| KR | 1020060074975 A | 7/2006 |
| KR | 1020080030838 A | 4/2008 |

* cited by examiner

LAYOUT OF SEMICONDUCTOR DEVICE

CROSS-REFERENCE TO RELATED APPLICATION

The priority of Korean patent application No. 10-2009-0000423 filed Jan. 5, 2009, the disclosure of which is hereby incorporated in its entirety by reference, is claimed.

BACKGROUND OF THE INVENTION

The present invention relates to a layout of a semiconductor device.

Generally, a semiconductor device forms two transistors in one active region using an active region of I-type or G-type, so that it results in a "one active region and two capacitors therein" structure. However, the "one active region and two capacitors therein" structure encounters a bridge problem between neighboring patterns so that it unavoidably deteriorates characteristics of a semiconductor device. In more detail, with the increasing degree of integration of a semiconductor device, higher-aspect-ratio patterns are laminated in the semiconductor device. In this case, some patterns fall down so that they bridge neighboring patterns, resulting in a deterioration of characteristics of the semiconductor device. In brief, this problem is generally referred to as a bridge problem.

FIG. 1 is a plan view illustrating the layout of a semiconductor device according to the related art. FIGS. 2A to 2D are cross-sectional views illustrating a method for forming a semiconductor device according to the related art.

Referring to FIG. 1, an active region 14, a word line 16, landing plugs 22a and 22b, a bit line contact 26, a bit line 27, and a storage electrode contact (not shown) are formed on a semiconductor substrate 10. The active region 14 is defined by a device isolation region 12. The word line 16 vertically traverses the active region 14 to be trisected. The landing plugs 22a and 22b are formed on each trisected active region 14. The bit line contact 26 is connected to the landing plug 22a located at the center of the trisected active region 14, and is arranged in parallel to the word line 16. The bit line 27 is connected to the bit line contact 26, and is arranged perpendicular to the word lines 16. The storage electrode contact (not shown) is connected to the trisected landing plugs 22b. For convenience of explanation, detailed description of the layout of the conventional semiconductor device will be limited only up to the storage electrode contacts (not shown).

Referring to FIG. 2A, an active region 14 defined by a device isolation region 12 is formed on a semiconductor substrate 10, and a conductive layer and a hard mask layer are deposited on the active region 14 and then patterned, so that the word line 16 including a spacer 18 is formed on the active region 14.

Referring to FIG. 2B, after an interlayer insulating layer 20 is formed on an overall upper surface including the word line 16, and then selectively removed to form a recess and expose the active region 14. Then, conductive material is filled in the recess and contacts the exposed active region 14 to form landing plugs 22a and 22b. In this case, if the spacer formed at the sidewalls of the word line is removed due to misalignment, the word line 16 becomes electrically connected with the landing plugs 22a or 22b, and thus an electrical short may occur. In this case, the landing plugs are classified into one landing plug 22a connected to a bit line and another landing plug 22b connected to a storage electrode.

Referring to FIG. 2C, a first interlayer insulating layer 24 is formed on the overall structure including the landing plugs 22a and 22b, and selectively etched to expose the landing plug 22a to form a bit line contact region. Then, conductive material is filled in the bit line contact region to form a bit line contact 26. Even in this step, there is a possibility that the bit line contact 26 and the word line 16 are electrically connected due to misalignment. Thereafter, a bit line (not shown) is formed to be in contact with the bit line contact 26.

Referring to FIG. 2D, a second interlayer insulating layer 28 is formed on an overall upper surface, and the first and second interlayer insulating layers 24, 28 are selectively etched to expose the landing plug 22b. Conductive material is formed on the exposed landing plug 22b to form a storage electrode contact 30.

The conventional semiconductor device having the above-mentioned layout structure has a disadvantage in that an electrical short occurs easily due to misalignment. In addition, as the distance between neighboring layers becomes shorter as a semiconductor device shrinks in size.

BRIEF SUMMARY OF THE INVENTION

Various embodiments of the present invention are directed to provide a semiconductor device layout that substantially obviates limitations and disadvantages of the related art. According to the related art in which two transistors are formed in one active region, electrical connection between a word line and a landing plug may easily occur and this problem becomes more serious as a channel length of a semiconductor device becomes shorter.

In accordance with an aspect of the present invention, a first active region provided on a substrate, the first active region having an "L" shape;

a second active region provided adjacent to the first active region, the second active region having a mirrored "L" shape; and an isolation region separating the first active region and the second active region. The active region having the above-mentioned shapes increases a margin, resulting in the prevention of a bridge encountered between neighboring landing plugs.

Preferably, the first active region is provided along a first row and the second active region is provided along a second row, the first and second active regions being symmetrically arranged to each other with respect to a column direction.

Preferably, a first word line extending across over the first and second active regions; and a second word line extending across over the first and second active regions, the second word line being provided adjacent to the first word line, wherein the first word line includes a first extension extending in a first row direction and the second word line includes a second extension extending in a second row direction that is in an opposing direction to the first row direction.

Preferably, the first and second active regions each has a short region and a long region, wherein the first and the second word line traverse over the long region of the first and second active regions, respectively.

Preferably, the first and second word lines expose ends of each of the first and second active regions, the semiconductor device layout further comprising:

a bit line landing plug formed over one end of each of the first and second active regions exposed by the first and second word lines; and a storage electrode landing plug formed over the other end of each of the first and second active regions exposed by the first and second word lines, wherein the bit line landing plug and the corresponding storage electrode landing plug are formed on opposite sides of each other with respect to the first or second word line.

Preferably, the bit line landing plug and the corresponding storage electrode landing plug are on different lines.

Preferably, the semiconductor device layout may further comprising:

a bit line contact formed over and electrically connected to the bit line landing plug.

Preferably, the semiconductor device layout may further comprising:

a bit line arranged perpendicular to the first and the second word lines, wherein the bit line contact is no larger than the bit line landing plug.

Preferably, the semiconductor device layout may further comprising:

a storage electrode contact formed over and electrically connected to the storage electrode landing plug.

Preferably, the semiconductor device layout wherein the device further comprises:

a first storage electrode contact extending in one direction parallel to the row; and a second storage electrode contact extending in the opposite direction to the first storage electrode contact.

Preferably, the first and the second storage electrode contact are shaped like a square.

Preferably, the semiconductor device layout may further comprising:

a first storage electrode formed over and electrically connected to the first storage electrode contact; and a second storage electrode formed over and electrically connected to the second storage electrode contact, wherein the first and the second storage electrode formed in zigzag format along the column direction.

Preferably, the semiconductor device layout may further comprising:

a first active region in an "L" shape formed in an odd row;

a second active region in a mirrored "L" shape formed in an even row;

a first word line running traversing over the first and second active regions an odd column and a second word running traversing over the first and second active regions in an even column, the first word line including an first extension extending in a first row direction and the second word line including a second extension extending in an opposite direction to the first extension;

a bit line landing plug formed over one end of each of the first and second active regions exposed by the first and second word lines; and a storage electrode landing plug formed over the other end of each of the first and the second active regions exposed by the first and second word lines, wherein the bit line landing plug and the storage electrode landing plug are formed on opposite sides to each other with respect to the first or second word line.

Preferably, the bit line landing plug and the storage landing plug electrically connected to the same active region are provided in different lines.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like element.

FIGS. 3A to 3G illustrate the layouts of a semiconductor device according to embodiments of the present invention.

Figure 3A:
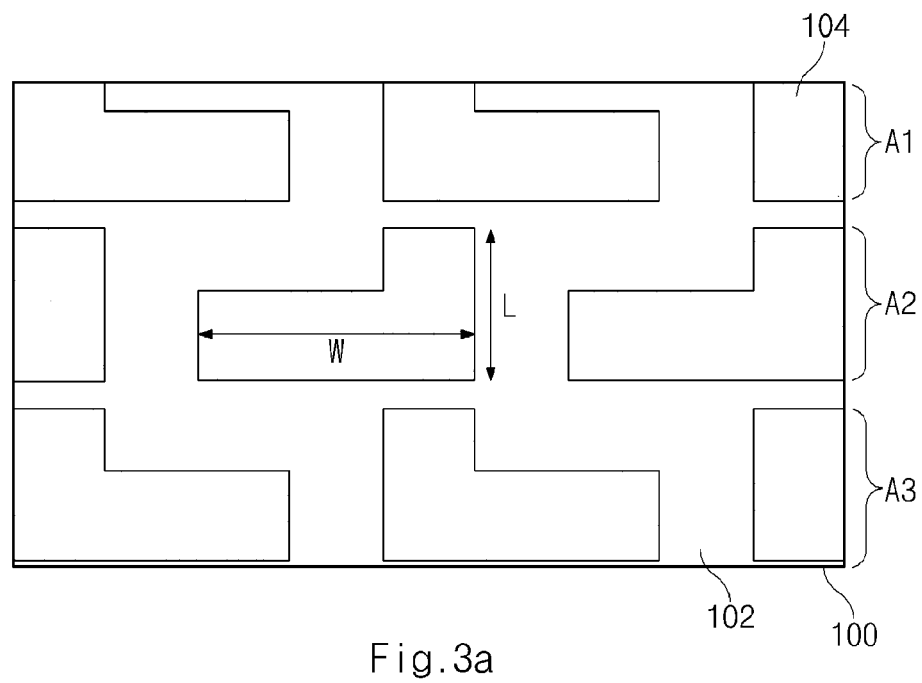
FIGS. 3A to 3G illustrate the layouts of a semiconductor device according to embodiments of the present invention.

Referring to FIG. 3a, an active regions 104 defined by a device isolation layer 102 is formed on a semiconductor substrate 100. In this case, the active region 104 is formed to have an "L"-shaped structure in which a vertical axis (L) is short and a horizontal axis (W) is relatively long. In another embodiment, the vertical axis may be long and the horizontal axis is short. In yet another embodiment, the vertical axis and the horizontal axis is substantially the same.

In the present embodiment, neighboring rows in a vertical direction are symmetrical to each other with respect to the vertical axis (L). For convenience of description, the direction of the horizontal axis (W) of the active region 104 is referred to as a "row." A first row A1 includes an "L"-shaped active region 104, and a second row A2 includes a "mirrored L"-shaped active region 104 which has a mirror image of "L" and is symmetrical to the "L"-shaped active region 104 of the first row A1 with respect to the vertical axis (L). A third row A3 includes an "L"-shaped active region 104 which is symmetrical to the "mirrored L"-shaped active region 104 of the second row A2 with respect to the vertical axis (L). That is, the third row A3 is configured as the first row A1. In this way, the active region 104 in each odd row has an "L" shape, and the active region 104 in each even row has a "mirrored L" shape which is symmetrical to the "L"-shape in each odd row with respect to the vertical axis (L). The reason why the active region is defined as described above is to provide an additional margin and prevent a bridge between neighboring landing plugs from occurring.

Figure 3B:
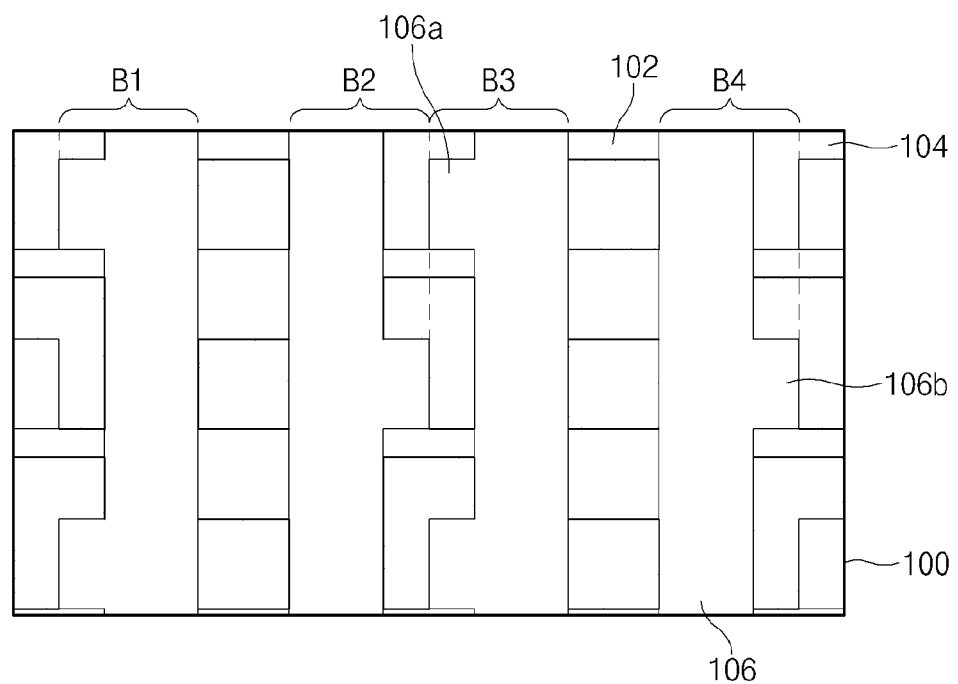

Referring to FIG. 3b, a word line 106 is arranged in parallel to the vertical axis (L) of the active region 104. The word line 106 is formed along a short axis (L) of each active region 104, and includes a first extended word line 106a or a second extended word line 106b, each of which is extended along a long axis (W) of the active region 104. The first and the second extended word lines 106a and 106b of the word line 106 are extended along opposite directions from each other. Here, the short axis of the active region 104 is a vertical axis (L) of the active region 104, and the long axis of the active region 104 is a horizontal axis (W) of the active region 104. In other words, the word line 106 corresponding to a first column B1 includes the first extended word line 106a, which is extended to the left side along the long axis of the active region 104 in each odd row (i.e., each of first and third rows A1 and A3). The word line 106 corresponding to a second column B2 includes the second extended word line 106b, which is extended to the right side along the long axis of the active region 104 in each even row (i.e., the second row A2). In this way, the word line 106 in each odd column has the first extended word line 106a, which is extended to the left side toward the active region 104 in each odd row. In addition, the word line 106 in each even column has the second extended word line 106b, which is extended to the right side toward the active region 104 in each even row.

Figure 3C:
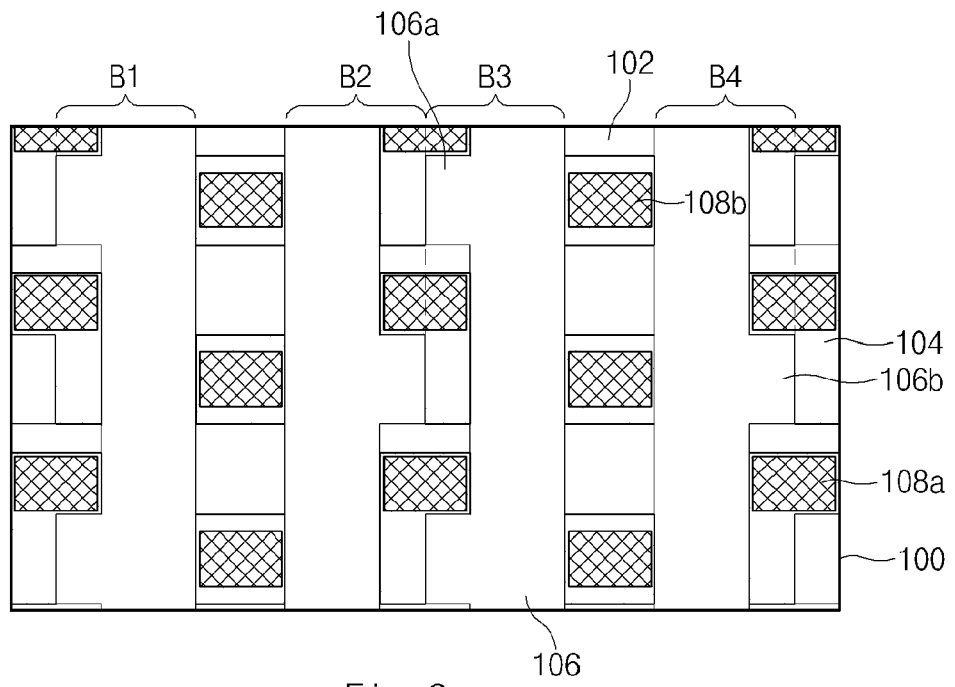

Referring to FIG. 3c, a landing plug 108a and a second landing plug 108b are formed on the active region 104. The first landing plug 108a is located at the end of the short axis of the active region 104. In other words, the first landing plug 108a is located on both sides of the first extended word line 106a so as to connect to the active region 104. The first landing plug 108a is connected to a bit line contact in a subsequent process. The second landing plug 108b is located at the end of the long axis of the active region 104. In other words, the second landing plug 108b is located on the opposite side to the first landing plug 108a with respect to the word line 106 so as to electrically connect to the active region 104. The second landing plug 108b is connected to the storage electrode contact in a subsequent process. In this manner, the first and the second landing plugs 108a and 108b are not formed on the same line, but are arranged in a zigzag manner at opposite sides of the word line 106.

Figure 1:
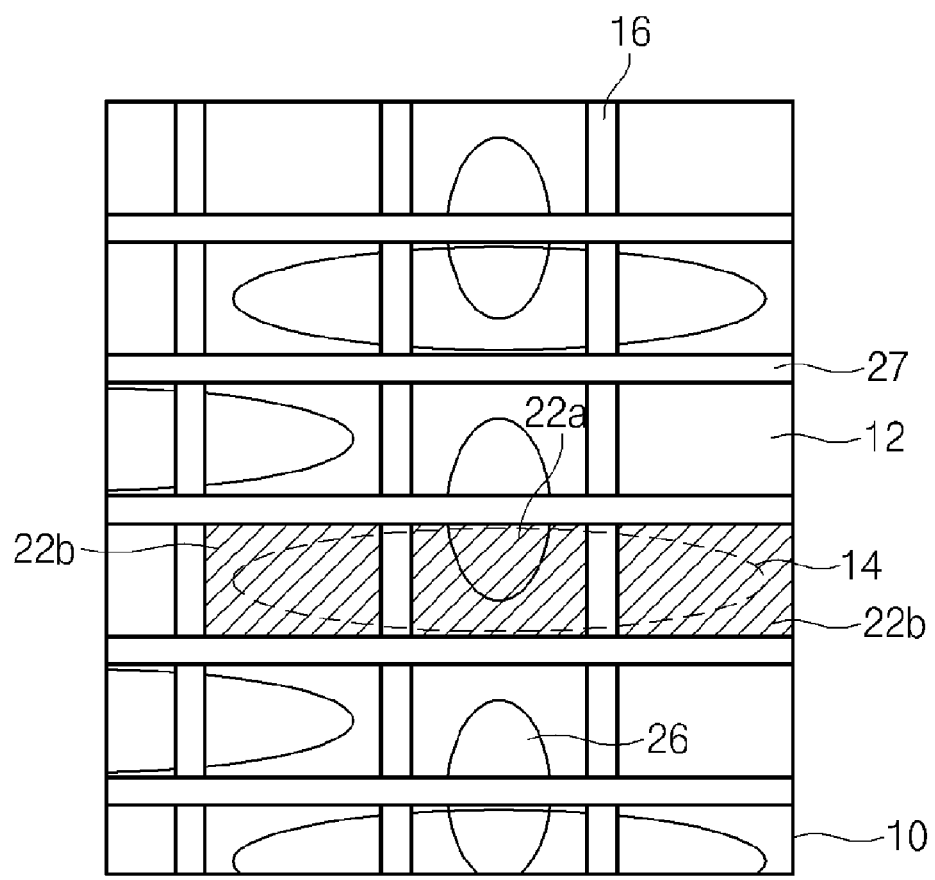
FIG. 1 is a plan view illustrating the layout of a semiconductor device according to the related art.
Figure 2A:
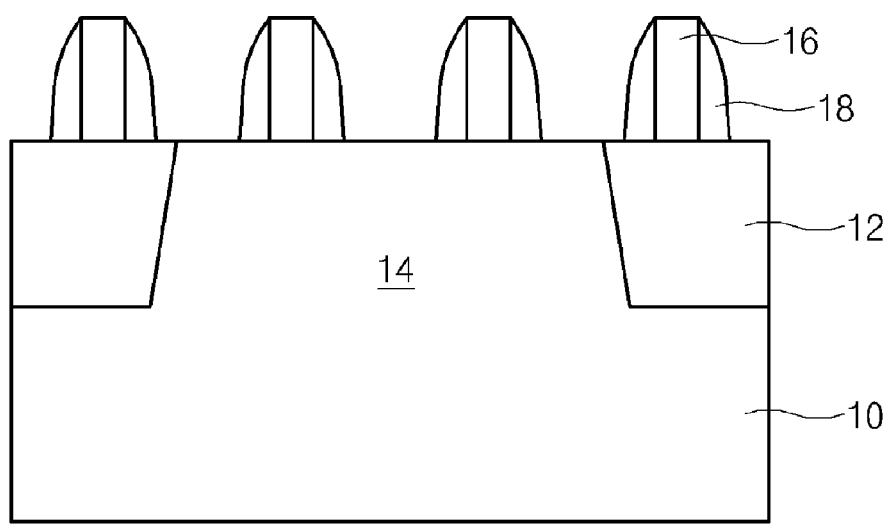
FIGS. 2A to 2D are cross-sectional views illustrating a method for forming a semiconductor device according to the related art.
Figure 2B:
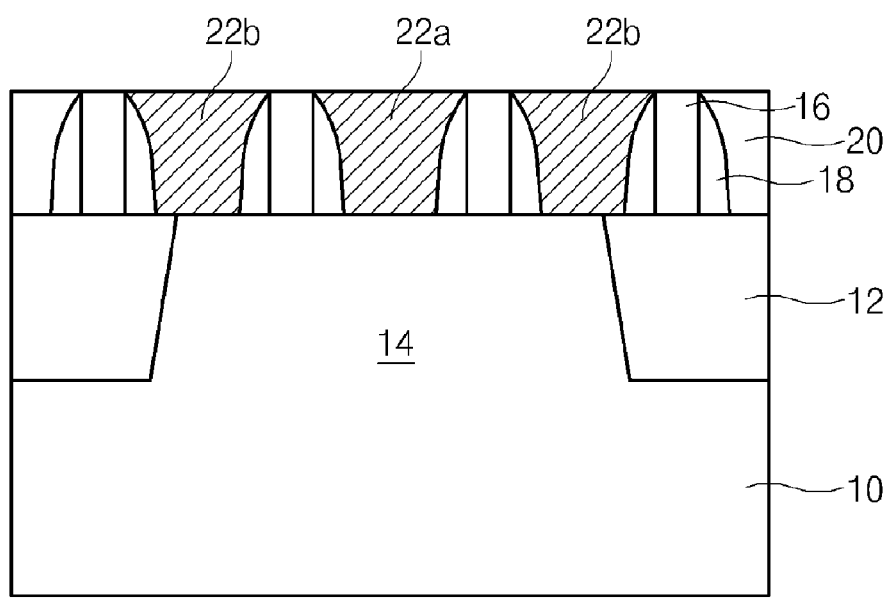
Figure 2C:
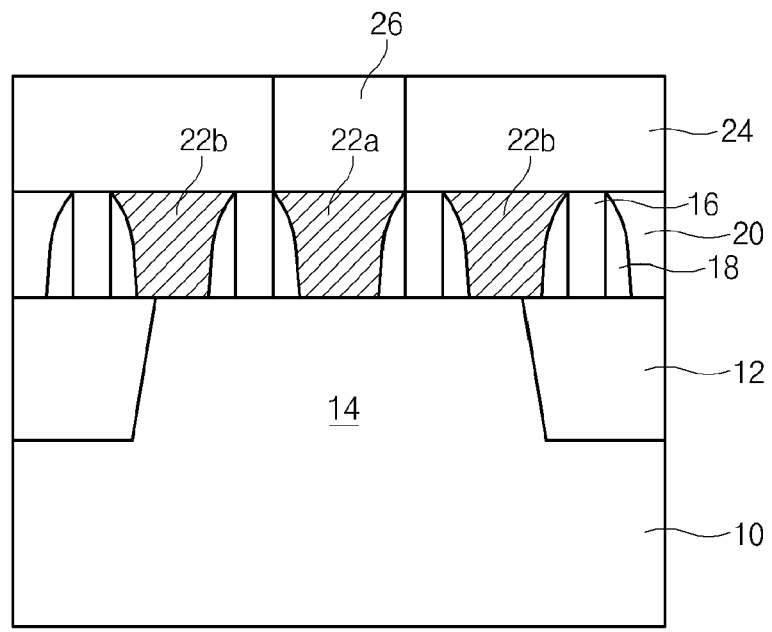
Figure 2D:
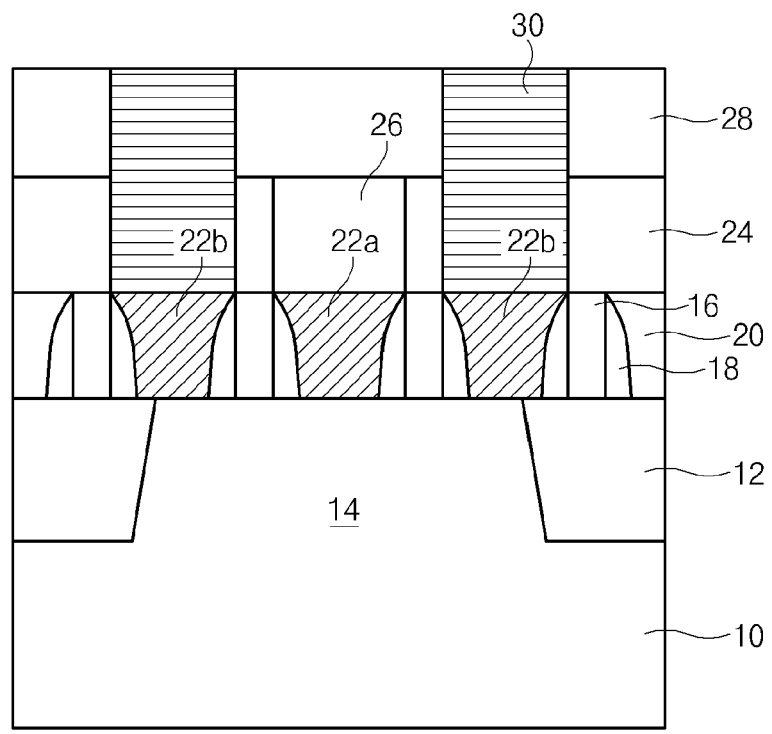
Figure 3D:
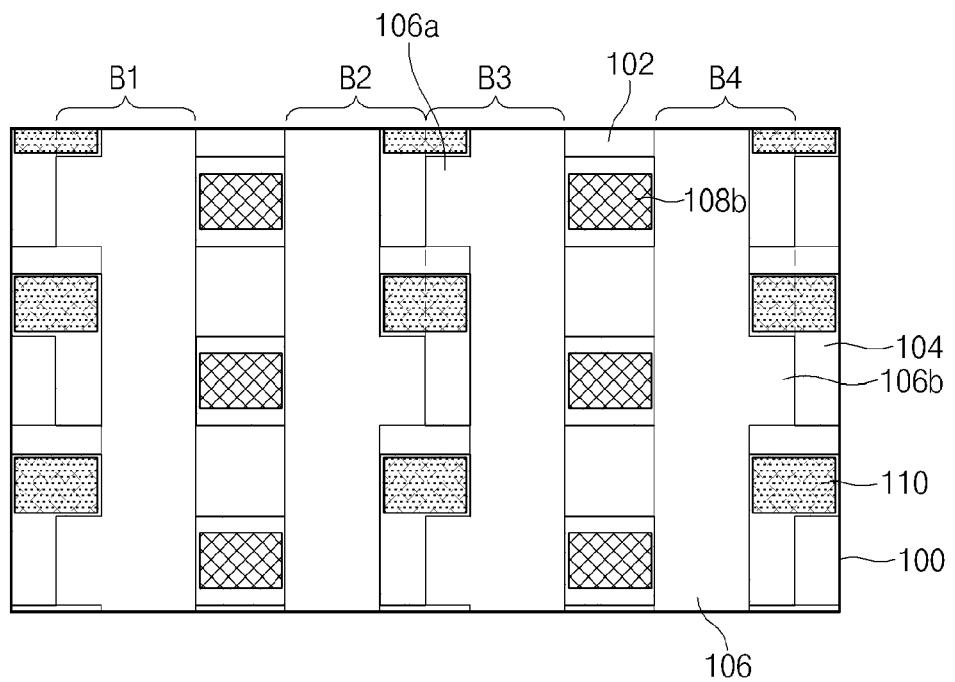

Referring to FIG. 3d, the bit line contact 110 is formed on the first landing plug 108a. The bit line contact 110 of FIG. 3D is formed in the same size as or smaller size than the first landing plug 108a, whereas a bit line contact shown in the related art (FIG. 1) is configured in an oval shape extended along the direction of the word line to interconnect the landing plug and the bit line. That is, the first and the second landing plugs 108a and 108b are not formed on the same line according to the present invention, whereas the bit line contact and storage electrode contact are formed on the same line. Thus, the bit line contact of FIG. 3D may be formed in smaller size than that of the related art. Accordingly, it is possible to prevent a bridge between the misaligned bit line contact and the word line 106. Preferably, a cross-sectional shape of the bit line contact 110 may be a square or a rectangle.

Figure 3E:
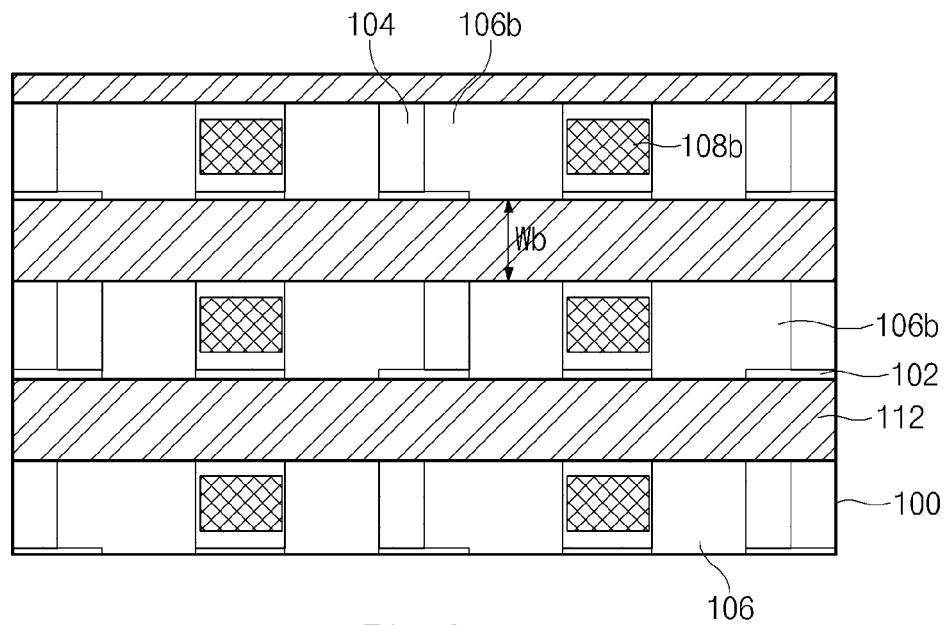

Referring to FIG. 3e, a bit line 112 is perpendicular to the word line 106 and is connected to the bit line contact 110. Therefore, the bit line 112 is formed on the same line as that of the first landing plug 108a. A width (Wb) of each bit line 112 is adjusted to enlarge the area of a storage electrode contact connected to the second landing plug 108b by increasing the distance between the bit lines 112. As a result, the margin of the storage electrode contact connected to the second landing plug 108b formed in the subsequent process may be increased.

Figure 3F:
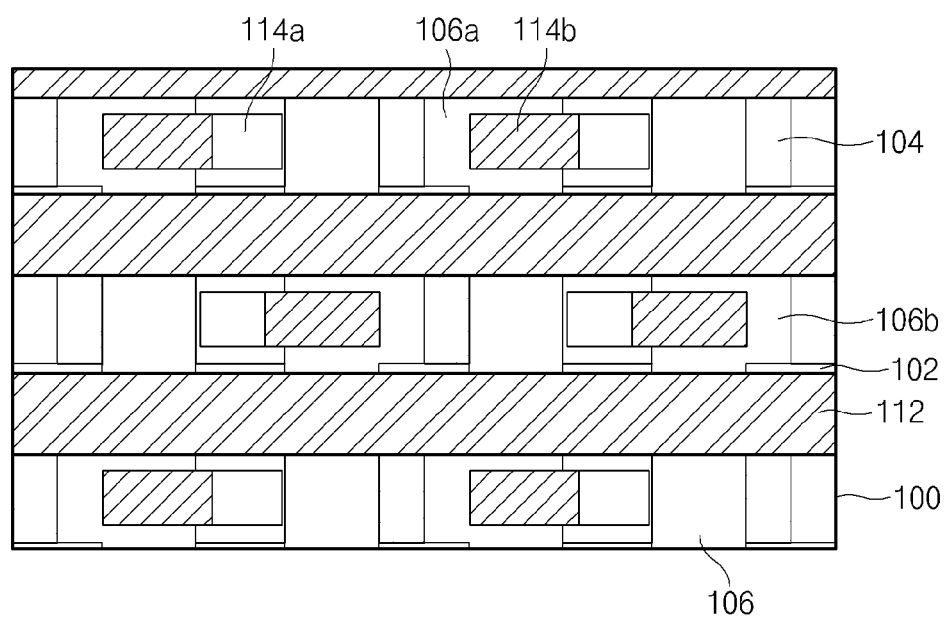

Referring to FIG. 3f, a first storage electrode contact 114a in an odd row is arranged to be in electrical contact with the second landing plug 108b and extends along one direction, and a second storage electrode contact 114b in an even row is arranged to be in electrical contact with the storage electrode contact 114a and extends along the opposite direction of the first storage electrode contact 114a. The first storage electrode contact 114a and the second storage electrode contact 114b are arranged in opposite directions in order to increase a process margin required to form the storage electrode in a subsequent process. A cross-sectional shape of the first and second storage electrode contacts 114a and 114b may be a square or a rectangle.

Figure 3G:
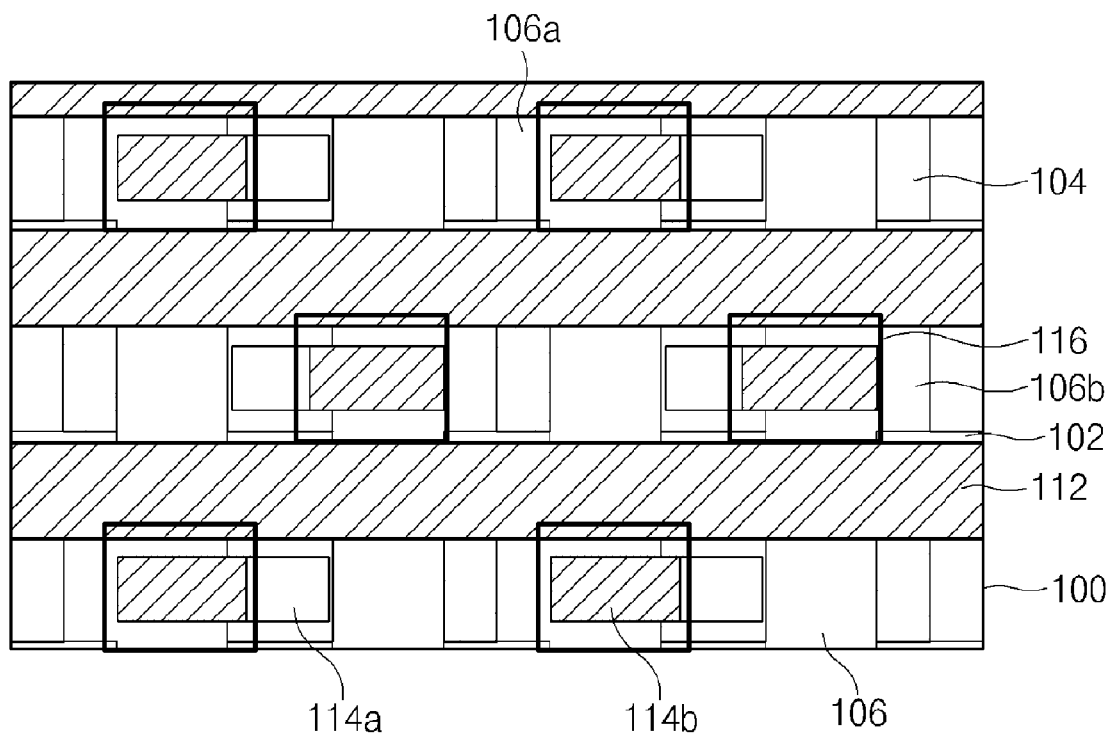

Referring to FIG. 3g, a storage electrode 116 is formed on the end of the first and the second storage electrode contact 114a and 114b. Accordingly, the storage electrode 116 becomes electrically connected to the active region 104. As described above, since the first and second storage electrode contacts 114a and 114b in an odd row and in an even row extend along opposite directions, the storage electrodes 116 in an odd row and an even row are arranged along different vertical axes from each other. Thus, a process margin for a semiconductor device may be increased. In addition, it is possible to prevent a semiconductor device from being deteriorated due to bridging.

The active region is formed in an L shape in an odd row and in a reversed-L shape in an even row, so that the landing plug for a bit line contact and the landing plug for a storage electrode contact are located in different lines from each other. Such structure enables the landing plug connected to the bit line contact to be made smaller, thereby preventing bridging and allowing a longer channel length.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device layout comprising: a first and a second "L" shaped active regions formed in a first row; a third and a fourth "L" shaped active regions formed in a second row;
    a first word line passing between the first and the second "%" shaped active regions and extending across the third "L" shaped active region; and
    a second word line extending across the second "L" shaped active region and passing between the third and the fourth "L" shaped active regions,
    wherein the first, the second, the third, and the fourth "L" shaped active regions each have short regions and long regions,
    wherein the short regions of the second and the third "L" shaped active regions are arranged in a same line along a first direction,
    wherein the long regions of the first and the second "L" shaped active regions protrude along a second direction perpendicular to the first direction,
    wherein the long region of the third and the fourth "L" shaped active region protrudes along a third direction opposite to the second direction,
    wherein the first word line includes a first extension that overlaps with the short region of the third "L" shaped active region, and
    wherein the second word line includes a second extension that overlaps with the short region of the second "L" shaped active region.

2. The semiconductor device layout according to claim 1, wherein the short regions of the second and the third "L" shaped active regions are provided between the first word line and the second word line.

3. The semiconductor device layout according to claim 1,
    wherein the second word line traverses over the long region of the second "L" shaped active region, and
    wherein the first word line traverses over the long region of the third active region.

4. The semiconductor device layout according to claim 1, wherein the first word line exposes first and second ends of the third "L" shaped active region, wherein the first end of the third "L" shaped active region extends in the third direction, wherein the second end of the third "L" shaped active region extends in the first direction,
    wherein the second word line exposes first and second ends of the second "L" shaped active region, wherein the first end of the second "L" shaped active region extends in the second direction, wherein the second end of the second "L" shaped active region extends in the first direction, and
    wherein the device layout further comprises:

a first bit line landing plug formed over the second end of the second "L" shaped active region that is exposed by the second word line:
a second bit line landing plug formed over the second end of the third "L" shaped active region that is exposed by the first word line;
a first storage electrode landing plug formed over the first end of the second "L" shaped active regions that is exposed by the second word line; and
a second storage electrode landing plug formed over the first end of the third "L" shaped active regions that is exposed by the first word line.

5. The semiconductor device layout according to claim 4, wherein the first and the second bit line landing plugs are formed over the short regions of the second and the third "L" shaped active regions, respectively, and
wherein the first and the second storage electrode landing plugs are formed over the long regions of the second and the third "L" shaped active regions, respectively.

6. The semiconductor device layout according to claim 4, the semiconductor device layout further comprising:
first and second bit line contacts formed over and coupled to the first and the second bit line landing plugs, respectively.

7. The semiconductor device layout according to claim 6, the semiconductor device layout further comprising:
a bit line arranged perpendicular to the first and the second word lines,
wherein widths of the first and the second bit line contacts are no larger than widths of the first and the second bit line landing plugs, respectively.

8. The semiconductor device layout according to claim 4, the semiconductor device layout further comprising:
first and second storage electrode contacts formed over and coupled to the first and the second storage electrode landing plugs, respectively.

9. The semiconductor device layout according to claim 4, wherein the device layout further comprises:
a first storage electrode contact extending along the third direction and coupled to the first storage electrode landing plug; and
a second storage electrode contact extending along the second direction and coupled to the second storage electrode landing plugs.

10. The semiconductor device layout according to claim 9, wherein the first and the second storage electrode contacts are each in square or rectangular shapes.

11. The semiconductor device layout according to claim 9, the semiconductor device layout further comprising:
a first storage electrode formed over and coupled to the first storage electrode contact: and
a second storage electrode formed over and coupled to the second storage electrode contact,
wherein the first and the second storage electrodes are formed in zigzag format.

12. A semiconductor device layout comprising: first and second active regions in an "L" shape formed in an odd row; third and fourth active regions in an "L" shape formed in an even row;
a first word line passing between the first and the second active regions and traversing over the third active region;
a second word line traversing over the second active region and passing between the third and the fourth active regions;
a bit line landing plug formed over any of the second and the third active regions that are exposed by the first and second word lines respectively; and
a storage electrode landing plug formed over any of the second and the third active regions that are exposed by the first and second word lines respectively,
wherein the first, the second, the third, and the fourth active regions each have short regions and long regions,
wherein the long regions of the first and the second active regions protrude along a first direction,
wherein the long regions of the third and the fourth active regions protrude along a second direction opposite to the first direction, and
wherein the short regions of the second and the third active regions are arranged in a same line along a third direction perpendicular to the first direction.

13. The device of claim 12, wherein the bit line landing plug is formed over the short region of any of the second and the third active regions, and the storage electrode landing plug is formed over the long region of any of the second and the third active regions.

14. The semiconductor device layout according to claim 1, wherein the first and the second word lines are disposed adjacent to each other.

15. The semiconductor device layout according to claim 1, wherein the short regions of the second and the third "L" shaped active regions are arranged along the first direction.

* * * * *